(12) United States Patent
Kim et al.

(10) Patent No.: US 8,358,173 B2
(45) Date of Patent: Jan. 22, 2013

(54) CMOS POWER AMPLIFIER

(75) Inventors: Youn Suk Kim, Gyunggi-do (KR); Chul Hwan Yoon, Gyunggi-do (KR); Joong Jin Nam, Seoul (KR); Ki Joong Kim, Jeollabuk-do (KR); Jun Goo Won, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 5 days.

(21) Appl. No.: 13/173,814

(22) Filed: Jun. 30, 2011

(65) Prior Publication Data

US 2012/0025914 A1     Feb. 2, 2012

(30) Foreign Application Priority Data

Jul. 29, 2010    (KR) ........................ 10-2010-0073640

(51) Int. Cl.
*H03F 3/16*      (2006.01)
(52) U.S. Cl. ...................... 330/277; 330/251
(58) Field of Classification Search .............. 330/277, 330/311, 207 A, 251, 51
See application file for complete search history.

(56) References Cited

U.S. PATENT DOCUMENTS

| | | | |
|---|---|---|---|
| 4,914,402 A * | 4/1990 | Dermitzakis et al. | 330/308 |
| 6,600,483 B1 | 7/2003 | Akita et al. | |
| 2002/0136324 A1 | 9/2002 | Nagasaka | |
| 2006/0006946 A1 | 1/2006 | Burns et al. | |
| 2009/0115463 A1 | 5/2009 | Matsuki | |
| 2009/0267691 A1 | 10/2009 | Chen | |
| 2011/0020011 A1 * | 1/2011 | Yazaki | 398/160 |
| 2011/0163812 A1 * | 7/2011 | Bansal et al. | 330/277 |
| 2012/0064852 A1 * | 3/2012 | Lee et al. | 455/341 |

FOREIGN PATENT DOCUMENTS

| | | |
|---|---|---|
| KR | 10-2002-0056830 A | 7/2002 |
| KR | 1020040030762 A | 9/2004 |
| KR | 10-2009-0065235 A | 6/2009 |

OTHER PUBLICATIONS

Korean Office Action 10-2010-0073640 issued Jun. 29, 2011.
German Office Action for Application No. 10 2011 106 570.2 mailed Sep. 27, 2012.

* cited by examiner

*Primary Examiner* — Henry Choe
(74) *Attorney, Agent, or Firm* — Lowe Hauptman Ham & Berner LLP

(57) ABSTRACT

A CMOS power amplifier includes: a first MOS transistor connected between a first power terminal and a first output stage and having a gate connected to an input stage; a second MOS transistor connected between the first output stage and a ground and having a gate connected to the input stage; a switching circuit unit connecting or separating a feedback line between the input stage and the first output stage to select a linear amplifying operation or a non-linear amplifying operation; and a resistor formed at the feedback line between the input stage and the first output stage to determine a linear amplification gain when the feedback line is turned on.

13 Claims, 4 Drawing Sheets

CMOS POWER AMPLIFIER

CROSS-REFERENCE TO RELATED APPLICATIONS

This application claims the priority of Korean Patent Application No. 10-2010-0073640 filed on Jul. 29, 2010, in the Korean Intellectual Property Office, the disclosure of which is incorporated herein by reference.

BACKGROUND OF THE INVENTION

1. Field of the Invention

The present invention relates to a CMOS power amplifier applicable to a front end module and, more particularly, to a CMOS power amplifier that can be selectively used as a non-linear amplifier or a linear amplifier by regulating an amplification gain thereof.

2. Description of the Related Art

In general, nearly 80% or more of the demand for mobile phones worldwide re for GSM (Global System for Mobile communication) phones using a non-linear signal, and EDGE or W-CDMA phones using a linear signal are anticipated to be widely preferred and used in the future market.

Thus, an amplifier that is able to selectively amplify a GSM signal and an EDGE/W-CDMA signal, as a single power amplifier, is required.

The related art power amplifier is classified into a non-linear amplifier that can amplify a non-linear signal such as a GSM signal and a linear amplifier chat can amplify a linear signal such as an EDGE/W-CDMA signal, and the like.

The operation principle of the non-linear amplifier is as follows. In the case of a GSM signal without information in an envelope thereof, an amplifier having a large gain is used in order to convert a changing envelope of an input signal into a uniform envelope.

The operation principle of the linear amplifier is as follows. In the case of an EDGE/W-CDMA signal having information in an envelope thereof, an amplifier must amplify an input signal such that it maintains a signal form with a uniform gain.

However, as for the related art power amplifier, a non-linear amplifier is required in order to amplify the non-linear signal such as the GSM signal or the like, and a linear amplifier is required in order to amplify the linear signal such as the EDGE/W-CDMA signal, and the like. Namely, in order to amplify the different signals, two different amplifiers must be purchased.

SUMMARY OF THE INVENTION

An aspect of the present invention provides a CMOS power amplifier that can be selectively used as a non-linear amplifier or a linear amplifier by regulating an amplification gain thereof.

According to an aspect of the present invention, there is provided a CMOS power amplifier including: a first MOS transistor connected between a first power terminal and a first output stage and having a gate connected to an input stage; a second MOS transistor connected between the first output stage and a ground and having a gate connected to the input stage; a switching circuit unit connecting or separating a feedback line between the input stage and the first output stage to select a linear amplifying operation or a non-linear amplifying operation; and a resistor formed at the feedback line between the input stage and the first output stage to determine a linear amplification gain when the feedback line is turned on.

The first MOS transistor may be a P channel MOS transistor having a source connected to the first power terminal and a drain connected to the first output stage.

The second MOS transistor may be an N channel MOS transistor having a drain connected to the first output stage and a source connected to a ground.

The switching circuit unit may be an N channel MOS transistor having a drain connected to the input stage, a source connected to the first output stage, and a gate receiving a switching signal.

The resistor may be a variable resistor that is able to regulate a resistance value thereof in order to adjust the linear amplification gain.

According to an aspect of the present invention, there is provided a CMOS power amplifier including: a driver stage receiving first power and amplifying an input signal; and a power stage receiving second power and amplifying power of a signal from the driver stage, wherein the driver stage includes: a first MOS transistor connected between a first power terminal and a first output stage and having a gate connected to an input stage; a second MOS transistor connected between the first output stage and a ground and having a gate connected to the input stage; a switching circuit unit connecting or separating a feedback line between the input stage and the first output stage to select a linear amplifying operation or a non-linear amplifying operation; and a resistor formed at the feedback line between the input stage and the first output stage to determine a linear amplification gain when the feedback line is turned on.

The first MOS transistor may be a P channel MOS transistor having a source connected to the first power terminal and a drain connected to the first output stage.

The second MOS transistor may be an N channel MOS transistor having a drain connected to the first output stage and a source connected to a ground.

The switching circuit unit may be an N channel MOS transistor having a drain connected to the input stage, a source connected to the first output stage, and a gate receiving a switching signal.

The resistor may be a variable resistor that is able to regulate a resistance value thereof in order to adjust the linear amplification gain.

The power stage may have a cascoded structure in which a plurality of amplifiers are stacked.

The power stage may include: a third MOS transistor having a gate connected to the first output stage, a source connected to a ground, and a drain; and a fourth MOS transistor having a drain connected to the second power terminal and to a second output stage, a source connected to the drain of the third MOS transistor, and a gate connected to a terminal of a first bias voltage.

The third and fourth MOS transistors are N channel MOS transistors, respectively.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
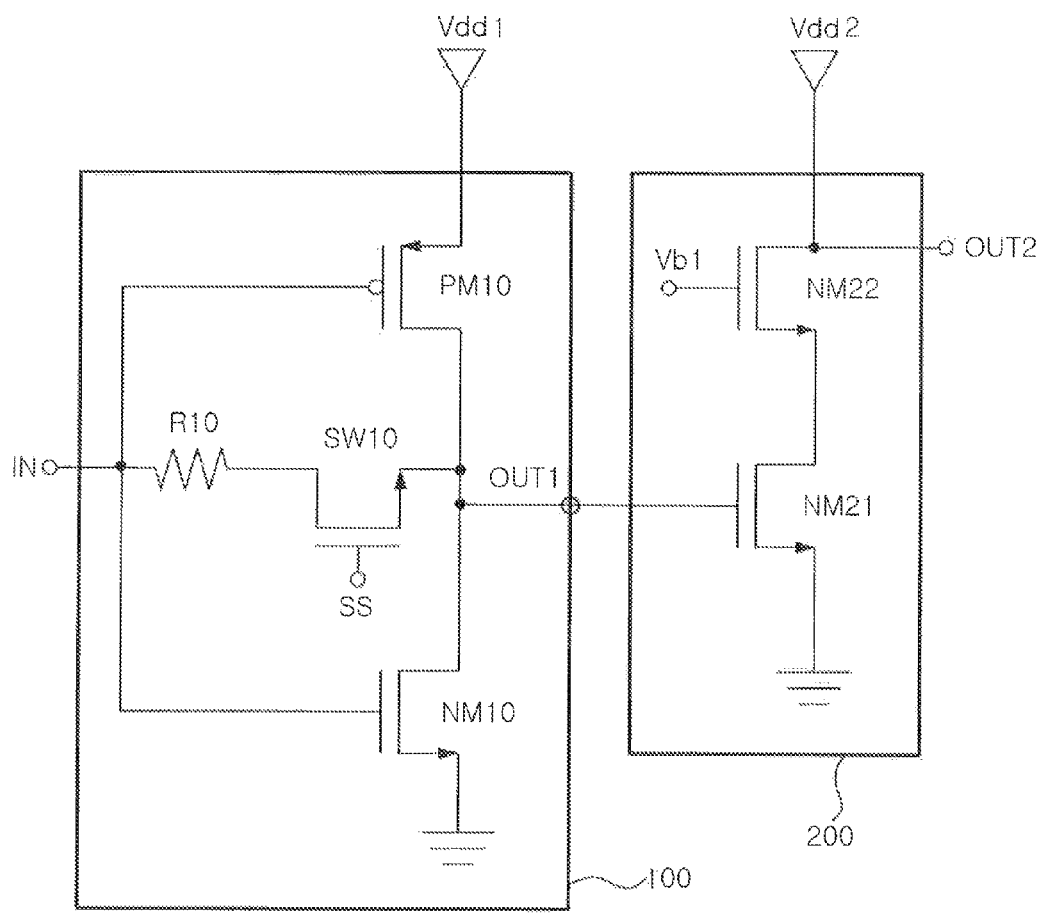
FIG. 1 is a circuit diagram of a CMOS power amplifier according to an exemplary embodiment of the present invention.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a circuit diagram of a CMOS power amplifier according to an exemplary embodiment of the present invention.

With reference to FIG. 1, the CMOS power amplifier according to an exemplary embodiment of the present invention may include a driver stage 100 receiving first power Vdd1 and amplifying an input signal, and a power stage 200 receiving second power Vdd2 and amplifying the power of a signal from the driver stage 100.

The driver stage 100 may include a first MOS transistor PM10 connected between the first power terminal Vdd1 and a first output stage OUT1 and having a gate connected to an input stage IN, a second MOS transistor NM10 connected between the first output stage OUT1 and a ground and having a gate connected to the input stage IN, a switching circuit unit SW10 shorting or opening a feedback line between the input stage IN and the first output stage OUT1 to select a linear amplifying operation or non-linear amplifying operation, and a resistor R10 formed at the feedback line between the input stage IN and the first output stage OUT1 to determine a linear amplification gain when the feedback line is turned on.

In an exemplary implementation, the first MOS transistor PM10 may be configured as a P channel MOS transistor having a source connected to the first power terminal Vdd1 and a drain connected to the first output stage 0UT1.

The second MOS transistor may be configured as an N channel MOS transistor having a drain connected to the first output stage OUT and a source connected to a drain.

The switching circuit unit SW10 may include an M channel MOS transistor having a drain connected to the input stage IN, a source connected to the first output stage 0UT1, and a gate receiving a switching signal SS.

The resistor R10 may be configured as a variable resistor that is able to control a resistance value to adjust the linear amplification gain.

The power stage 200 may be configured to have a cascade structure in which a plurality of amplifiers are stacked.

In an exemplary implementation, the power stage 200 may include a third MOS transistor NM21 having a gate connected to the first output stage OUT1, a source connected to a ground, and a drain, and a fourth MOS transistor NM22 having a drain connected to a terminal of the second power Vdd2 and to a second output stage OUT2, a source connected to the drain of the third MOS transistor NM21, and a gate connected to a terminal of a first bias voltage Vb1.

The third and fourth MOS transistors NM21 and NM22 may be configured as M channel MOS transistors, respectively.

Figure 2:
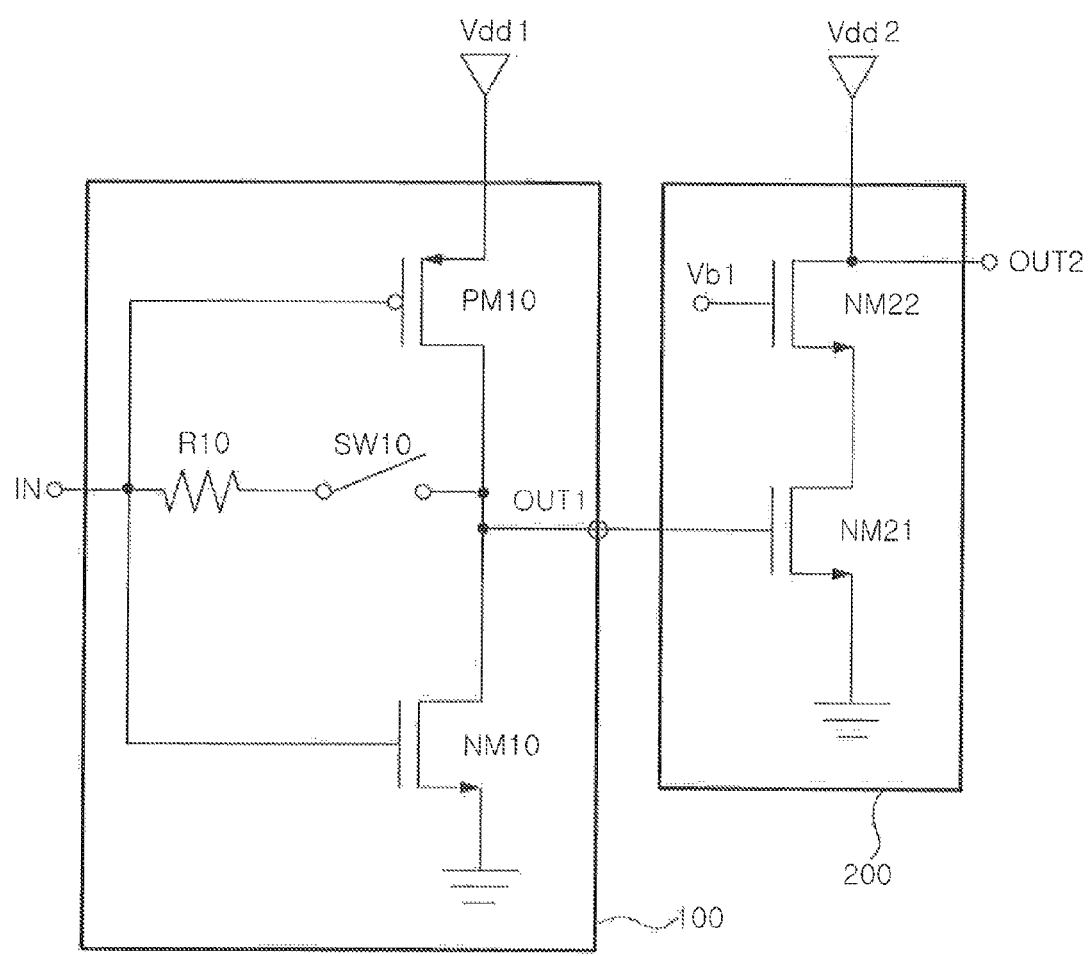
FIG. 2 is a circuit diagram of the CMOS power amplifier operating as a non-linear amplifier according to an exemplary embodiment of the present invention.
Figure 3:
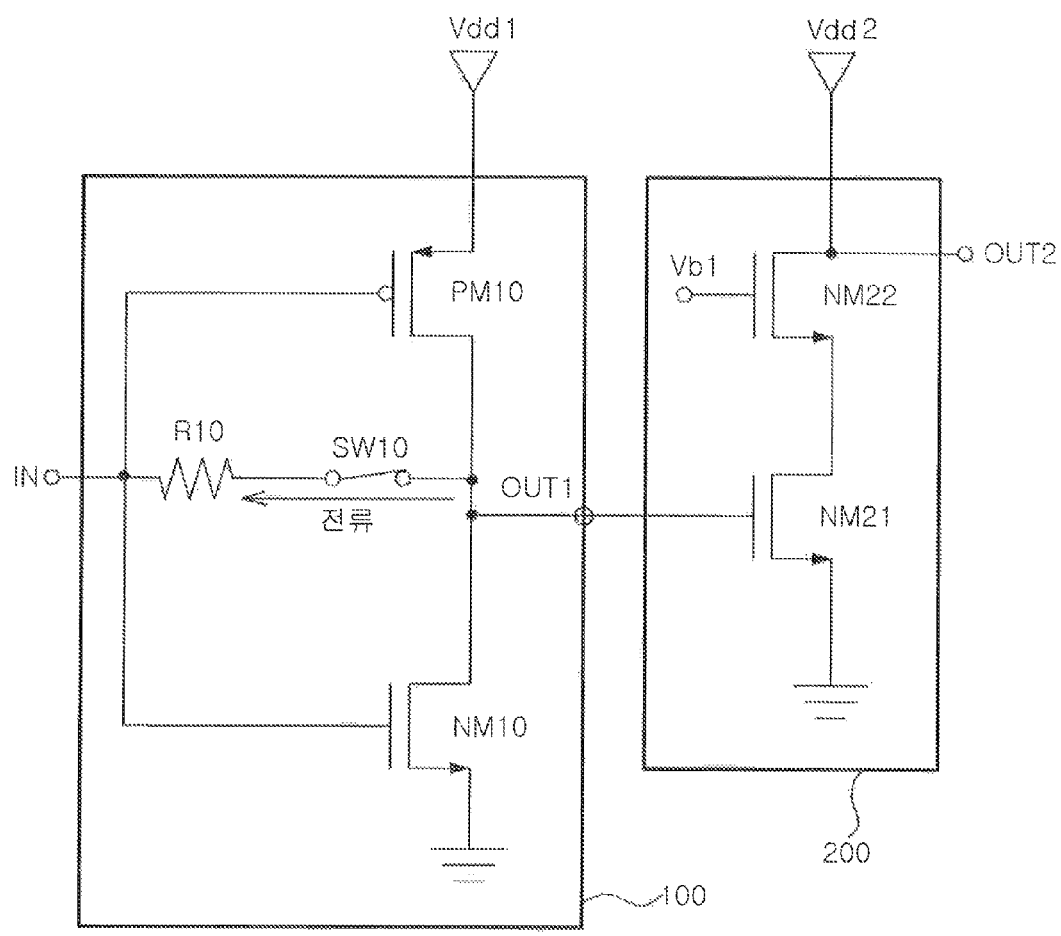
FIG. 3 is a circuit diagram, of the CMOS power amplifier operating as a linear amplifier according to an exemplary embodiment of the present invention.

FIG. 2 is a circuit diagram of the CMOS power amplifier operating as a non-linear amplifier according to an exemplary embodiment of the present invention, and FIG. 3 is a circuit diagram of the CMOS power amplifier operating as a linear amplifier according to an exemplary embodiment of the present invention.

In FIG. 2, the switching circuit unit SW10 is turned off, allowing the CMOSS power amplifier to operate as a non-linear amplifier.

In FIG. 3, the switching circuit unit SWIG is turned on, allowing the CMOSS power amplifier to operate as a linear amplifier.

Figure 4:
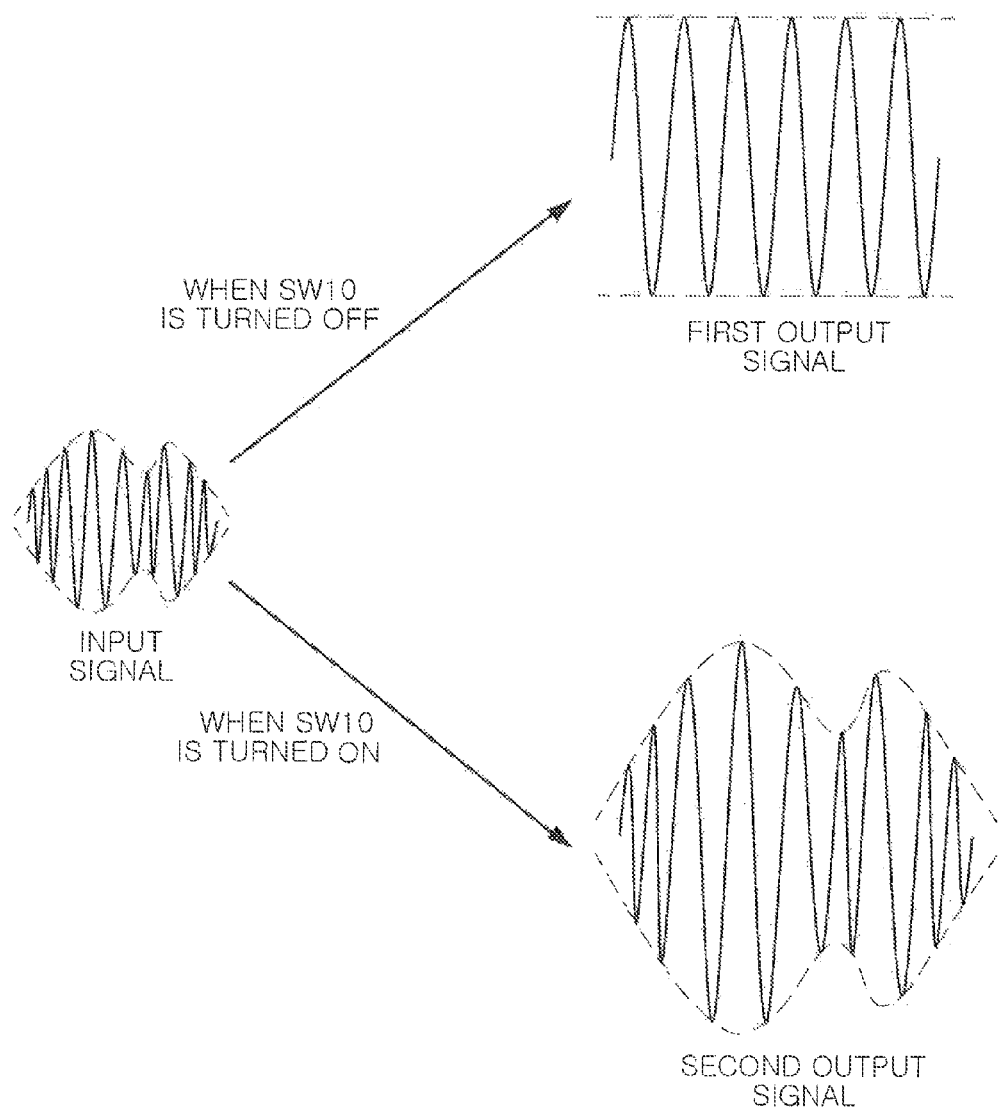
FIG. 4 is a view showing waveforms of input and output signals of the CMOS power amplifier according to an exemplary embodiment of the present invention.

FIG. 4 is a view showing the waveforms of input and output signals of the CMOS power amplifier according to an exemplary embodiment of the present invention.

As shown in FIG. 4, when an input signal in which there is no information in an envelope is input, the switching circuit unit SW10 is turned off, so a first output signal having a uniform peak level is output.

Also, when an input signal, in which there is information in the envelope, is input, the switching circuit unit SW10 is turned on to output at second output signal having a non-uniform peak level.

The operation and effect of the present invention will now be described with reference to the accompanying drawings.

The CMOS power amplifier according to an exemplary embodiment of the present invention will now be described with reference to FIGS. 1 to 4. In FIG. 1, the driver stage 100 included in the CMOS power amplifier according to an exemplary embodiment of the present invention receives the first power Vdd1, amplifies an input signal, and outputs the amplified signal to the power stage 200.

The power stage 200 receives the second power Vdd2 and amplifies the power of the signal from the driver stage 100.

Here, the first power Vdd1 and the second power Vdd2 may have the same voltage or different voltages.

With reference to FIG. 1, the driver stage 100 according to an exemplary embodiment of the present invention may operate as a linear amplifier or a non-linear amplifier. This will now be described.

With reference to FIG. 1, the driver stage 100 according to an exemplary embodiment of the present invention may include the first MOS transistor PM10, the second MOS transistor NM10, the switching circuit unit SW10, and the resistor R10.

The switching circuit unit SW10 is turned on or off to mate the CMOS power amplifier operate as a non-linear amplifier or a linear amplifiers so that the feedback line connected between the first output stage OUT1, to which the drain of the first MOS transistor PM10 and that of the second MOS transistor NM10 are connected, and the input stage IN can be connected or disconnected according to the switching signal SS.

First, in order to operate the MOS power amplifier as a non-linear amplifier, when the switching circuit unit SWIG is turned off, the feedback line between the input stage IN and the first output stage OUT1 is open.

When the feedback line is open through the switching circuit unit SW10, the CMOS power amplifier according to an exemplary embodiment of the present invention illustrated in FIG. 1 can operate as a non-linear amplifier as shown in FIG. 2.

Namely, when the switching circuit unit SW10 is configured as the N channel MOS transist or and the N channel MOS transistor is turned on by the switching signal SS, the feedback line between the input stage IN and the first output stage OUT1 is open, preventing current from flowing to the resistor R10. Then, the driver stage 100 according to an exemplary embodiment of the present invention has a large gain, and thus, the driver stage 100 can operate as a non-linear amplifier.

When the driver stage 100 operates as a nonlinear amplifier, an equivalent circuit thereof is that as shown in FIG. 2, and an input signal does not have information in the envelope thereof by the CMOS power amplifier according to an exemplary embodiment of the present invention, so the first output signal halving a uniform peak level as shown in FIG. 4 is output.

Meanwhile, in order to operate the CMOS power amplifier as a linear amplifier, when the switching circuit unit SW10 is turned on, the feedback line between the input stage IN and the first output stage OUT1 is connected.

When the feedback line is connected through the switching circuit unit SW10, the CMOS power amplifier according to an exemplary embodiment of the present invention illustrated in FIG. 1 can operate as a linear amplifier as shown in FIG. 3.

Namely, when the switching circuit unit SW10 is configured as the N channel MOS transistor and the N channel MOS transistor is turned off by the switching signal SS, the feedback line between the input stage IN and the first output stage OUT1 becomes short (or connected), allowing current to flow to the resistor R10 on the feedback line, so a current feedback from the first output stage 0UT1 to the input stage IN takes place In this case, the gain of the driver stage 100 can be adjusted by regulating a resistance value of the resistor R10, so the driver stage 100 according to an exemplary embodiment can be operated as a linear amplifier by adjusting the gain of the driver stage 100 to have a desired value.

When the driver stage 100 operates as a linear amplifier, an equivalent circuit thereof is that as shown in FIG. 3, and an input signal does not have information in the envelope thereof by the CMOS power amplifier according to an exemplary embodiment of the present invention, so the second output signal having information in the envelope as shown in FIG. 4 is output.

As described above, the switching circuit unit added to make the feedback line between the output stage and the input stage of the driver stage open or short. Thus the single CMOS power amplifier can operate as a non-linear amplifier or a linear amplifier by turning on or off the switching circuit unit.

As set forth above, according to exemplary embodiments of the invention, the single CMOS power amplifier can adjust an amplification gain thereof, so as to thereby be selectively used as a non-linear amplifier or a linear amplifier.

While the present invention has been shown and described in connection with the exemplary embodiments, it will be apparent to those skilled in the art that modifications and variations can be made without departing from the spirit and scope of the invention as defined by the appended claims.

What is claimed is:

1. A CMOS power amplifier comprising:
   a first MOS transistor connected between a first power terminal and a first output stage and having a gate connected to an input stage;
   a second MOS transistor connected between the first output stage and a ground and having a gave connected to the input stage;
   a switching circuit unit connecting or separating a feedback line between the input stage and the first output stage to select a linear amplifying operation or a non-linear amplifying operation; and
   a resistor formed at the feedback line between the input stage and the first output stage to determine a linear amplification gain when the feedback line is turned on.

2. The amplifier of claim 1, wherein the first MOS transistor is a P channel MOS transistor having a source connected to the first power terminal and a drain connected to the first output stage.

3. The amplifier of claim 2, wherein the second MOS transistor is an N channel MOS transistor having a drain connected to the first output stage and a source connected to a ground.

4. The amplifier of claim 3, wherein the switching circuit unit is an N channel MOS transistor having a drain connected to the input stage, a source connected to the first output stage, and a gate receiving a switching signal.

5. The amplifier of claim 4, wherein the resistor is a variable resistor that is able to regulate a resistance value thereof in order to adjust the linear amplification gain.

6. A CMOS power amplifier comprising:
   a driver stage receiving first power and amplifying an input signal; and
   a power stage receiving second power and amplifying power of a signal from the driver stage,
   wherein the driver stage comprises:
      a first MOS transistor connected between a first power terminal and a first output stage and having a gate connected to an input stage;
      a second MOS transistor connected between the first output stage and a ground and having a gate connected to the input stage;
      a switching circuit unit connecting or separating a feedback line between the input stage and the first output stage to select a linear amplifying operation or a nonlinear amplifying operation; and
      a resistor formed at the feedback line between the input stage and the first output stage to determine a linear amplification gain when the feedback line is turned on.

7. The amplifier of claim 6, wherein the first MOS transistor is a P channel MOS transistor having a source connected to first power terminal and a drain connected to the first output stage.

8. The amplifier of claim 7, wherein the second MOS transistor is an N channel MOS transistor having a drain connected to the first output stage and a source connected to a ground.

9. The amplifier of claim 8, wherein the switching circuit unit is an N channel MOS transistor having a drain connected to the input stage, a source connected to the first output stage, and a gate receiving a switching signal.

10. The amplifier of claim 9, wherein the resistor is a variable resistor that is able to regulate a resistance value thereof in order to adjust the linear amplification gain.

11. The amplifier of claim 10, wherein the power stage has a cascoded structure in which a plurality of amplifiers are stacked.

12. The amplifier of claim 11, wherein the power stage comprises:
   a third MOS transistor having a gate connected to the first output stage, a source connected to a ground, and a drain; and
   a fourth MOS transistor having a drain connected to the second power terminal and to a second output stage, a source connected to the drain of the third MOS transistor, and a gate connected to a terminal of a first bias voltage.

13. The amplifier of claim 11, wherein the third and fourth MOS transistors are N channel MOS transistors, respectively.

* * * * *